(12) United States Patent
Liu

(10) Patent No.: US 7,864,526 B2
(45) Date of Patent: Jan. 4, 2011

(54) HEAT DISSIPATION DEVICE

(75) Inventor: Heng Liu, Shenzhen (CN)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 0 days.

(21) Appl. No.: 12/491,251

(22) Filed: Jun. 25, 2009

(65) Prior Publication Data
US 2010/0232109 A1 Sep. 16, 2010

(30) Foreign Application Priority Data
Mar. 13, 2009 (CN) .................... 2009 1 0300837

(51) Int. Cl.
*H05K 7/20* (2006.01)
(52) U.S. Cl. .................. 361/695; 361/697; 361/703; 361/719; 165/80.3; 165/140.33
(58) Field of Classification Search .................. None
See application file for complete search history.

(56) References Cited

U.S. PATENT DOCUMENTS

| | | | | |
|---|---|---|---|---|
| 5,316,423 A | * | 5/1994 | Kin | 411/510 |
| 7,215,548 B1 | * | 5/2007 | Wu et al. | 361/703 |
| 7,349,212 B2 | * | 3/2008 | Xia et al. | 361/697 |
| 7,363,963 B2 | * | 4/2008 | Wang et al. | 165/80.3 |
| 7,443,676 B1 | * | 10/2008 | Li | 361/700 |
| 7,447,025 B2 | * | 11/2008 | Chen et al. | 361/696 |
| 7,448,437 B2 | * | 11/2008 | He | 165/80.4 |
| 7,448,438 B2 | * | 11/2008 | Xia et al. | 165/104.33 |
| 2007/0119566 A1 | * | 5/2007 | Peng | 165/80.3 |
| 2008/0115914 A1 | * | 5/2008 | Yang et al. | 165/104.33 |
| 2008/0121372 A1 | * | 5/2008 | Zhou et al. | 165/80.3 |
| 2008/0128111 A1 | * | 6/2008 | Zhou et al. | 165/80.3 |
| 2008/0135215 A1 | * | 6/2008 | Wu | 165/104.33 |
| 2008/0314556 A1 | * | 12/2008 | Zhou et al. | 165/80.3 |

* cited by examiner

*Primary Examiner*—Boris L Chervinsky
(74) *Attorney, Agent, or Firm*—Frank R. Niranjan

(57) ABSTRACT

A heat dissipation device for cooling an electronic device mounted on a printed circuited board includes a heat sink thermally contacting the electronic device, a fan defining a plurality of through holes in a periphery thereof and a fixing device fixing the fan on a side of the heat sink. A plurality of fasteners are attached on a bottom of the heat sink and fasten the heat sink on the printed circuited board. The fasteners block the through holes in a bottom of the fan. The fixing device includes fixing brackets attached to the heat sink and a plurality of resilient connecting devices. Each resilient connecting device has an end extending through a corresponding through hole in the bottom of the fan and connected to the fan, and another end connected to a bottom of a corresponding fixing bracket.

7 Claims, 4 Drawing Sheets

HEAT DISSIPATION DEVICE

BACKGROUND

1. Technical Field

The disclosure relates to heat dissipation devices and, more particularly, to a heat dissipation device convenient for disassembly.

2. Description of Related Art

Nowadays, numerous heat dissipation devices are used to dissipate heat generated by electronic devices. Conventionally, the heat dissipation device comprises a heat sink, a fan and a fixing device mounted on a side of the heat sink. The fan defines four through holes in four corners thereof. Four screws extend through the four through holes of the fan and engage in threaded holes of the fixing device to fixing the fan on the heat sink. A plurality of fasteners are attached to a bottom of the heat sink and fasten the heat sink on a printed circuit board to thereby make the heat sink intimately contact with an electronic device on the printed circuit board. Two of the fasteners block two screws at a bottom of the fan for saving space. In operation, the heat sink absorbs heat from the electronic device. The fan produces airflow to take the heat in the heat sink away.

The fan needs to be disassembled from the heat sink for maintenance or replacing with another fan after the fan is used for a long time. In disassembly, since the two fasteners block the two screws at the bottom of the fan, the process of disassembling the screws at the bottom of the fan via using a screwdriver is obstructed. Thus, it is inconvenient to disassemble the fan from the heat sink.

What is needed, therefore, is a heat dissipation device which can overcome the limitation described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
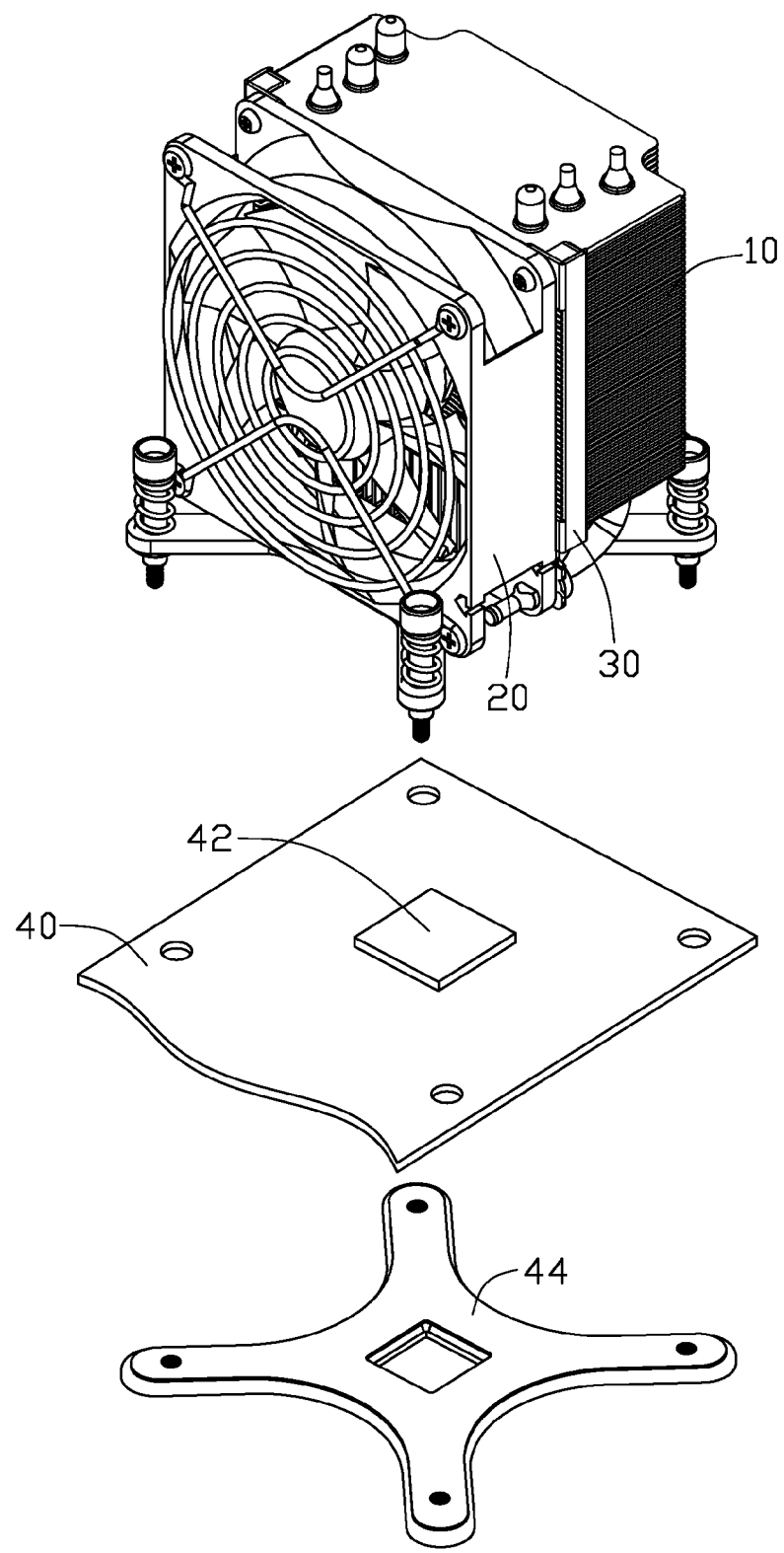
FIG. 1 is an isometric, assembled view of a heat dissipation device in accordance with one embodiment of the disclosure, with a printed circuit board located below the heat dissipation device.

FIG. 1 shows a heat dissipation device in accordance with an embodiment of the disclosure. The heat dissipation device is mounted on a printed circuit board 40 for dissipating heat generated by an electronic device 42 attached on the printed circuit board 40. The heat dissipation device comprises a heat sink 10, a fan 20 located at a front side of the heat sink 10 and a fixing device 30 fixing the fan 20 on the heat sink 10.

Figure 2:
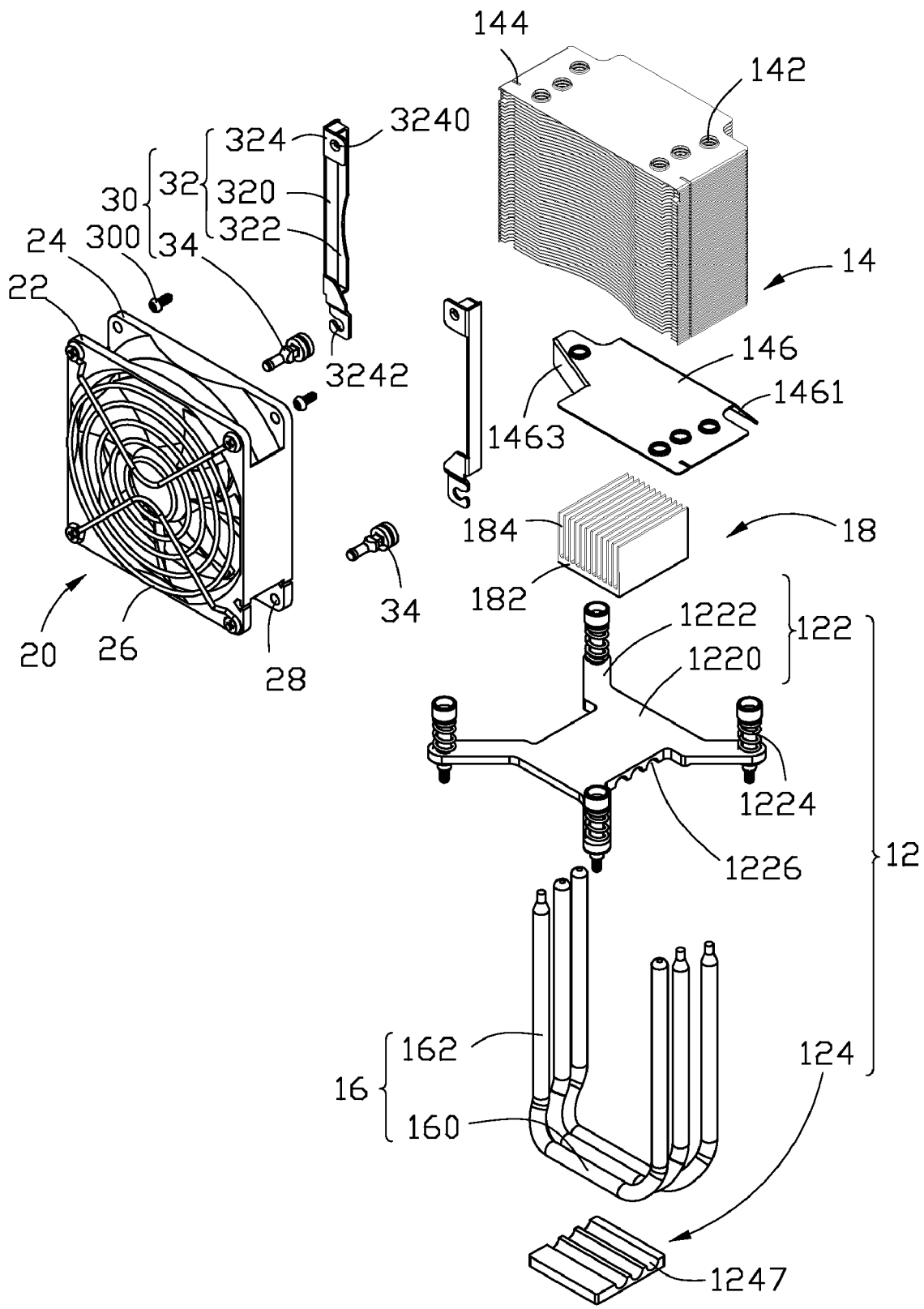
FIG. 2 is an isometric, exploded view of the heat dissipation device of FIG. 1.

Also referring to FIG. 2, the heat sink 10 includes a base 12, a first fin assembly 14, a second fin assembly 18 between the base 12 and the first fin assembly 14, and three U-shaped heat pipes 16 connecting the base 12 and the first fin assembly 14.

The base 12 includes a mounting plate 122 and a heat spreader 124 below the mounting plate 122. The mounting plate 122 includes a generally rectangular body 1220 and four arms 1222 outwardly and horizontally extending from four corners of the body 1220. Four fasteners 1224 are attached on the four arms 1222. The body 1220 defines three parallel first grooves 1226 in a bottom thereof. The heat spreader 124 is made of metal such as aluminum, copper or an alloy thereof. The heat spreader 124 has a bottom face thermally contacting the electronic device 42 and defines three parallel second grooves 1247 in a top face thereof. The three first grooves 1226 of the mounting plate 122 and the three second grooves 1247 of the heat spreader 124 cooperatively form three channels.

The first fin assembly 14 defines two inserting slits 144 in two opposite lateral sides thereof. The first fin assembly 14 includes a plurality of spaced first fins 146 stacked together. The first fins 146 each are made of metal such as aluminum, copper or an alloy thereof and define six through holes 142, except the lowermost first fin 146 which defines four through holes 142 only. The lowermost first fin 146 has a first guiding plate 1461 slantwise and downwardly extending from a rear side thereof away from the fan 20, and a second guiding plate 1463 downwardly extending from the front side thereof near the fan 20. Each of the first and second guiding plates 1461, 1463 is adapted for guiding a part of airflow from the fan 20 to other electronic devices (not shown) on the printed circuit board 40, thereby also cooling the other electronic devices.

The three heat pipes 16 each comprise a horizontal evaporating section 160 and two parallel condensing sections 162 upwardly extending from two ends of the evaporating section 160.

The second fin assembly 18 is integrally made of metal such as aluminum, copper or an alloy thereof. The second fin assembly 18 includes a heat conducting plate 182 and a plurality of second fins 184 upwardly extending from the heat conducting plate 182. Each of the second fins 184 of the second fin assembly 18 is vertical to the first fins 146 of the first fin assembly 14. The heat conducting plate 182 of the second fin assembly 18 has a bottom face thermally contacting a top face of the mounting plate 122 of the base 12.

The fan 20 is generally rectangular in shape and includes a first flange 22 and a second flange 24 near the first fin assembly 14. A fan cover 26 in the form of a cage is connected to the first flange 22 of the fan 20. Each of the first and second flanges 22, 24 defines four through holes 28 in four corners thereof.

The fixing device 30 includes two fixing brackets 32, two connecting devices 34 and two screws 300. Each of the two fixing brackets 32 includes an elongated body 320, a buckle plate 322 extending from a rear side of the body 320 and two positioning portions 324 extending from a front side of the body 320 remote from the buckle plate 322. The two positioning portions 324 are located at two distal ends (i.e., top and bottom ends) of the body 320, wherein the positioning portion 324 at the top end of the body 320 defines a threaded hole 3240, and the positioning portion 324 at the bottom end of the body 320 is substantially Ω-shaped and defines a cutout 3242 therein. The cutout 3242 opens laterally.

Figure 3:
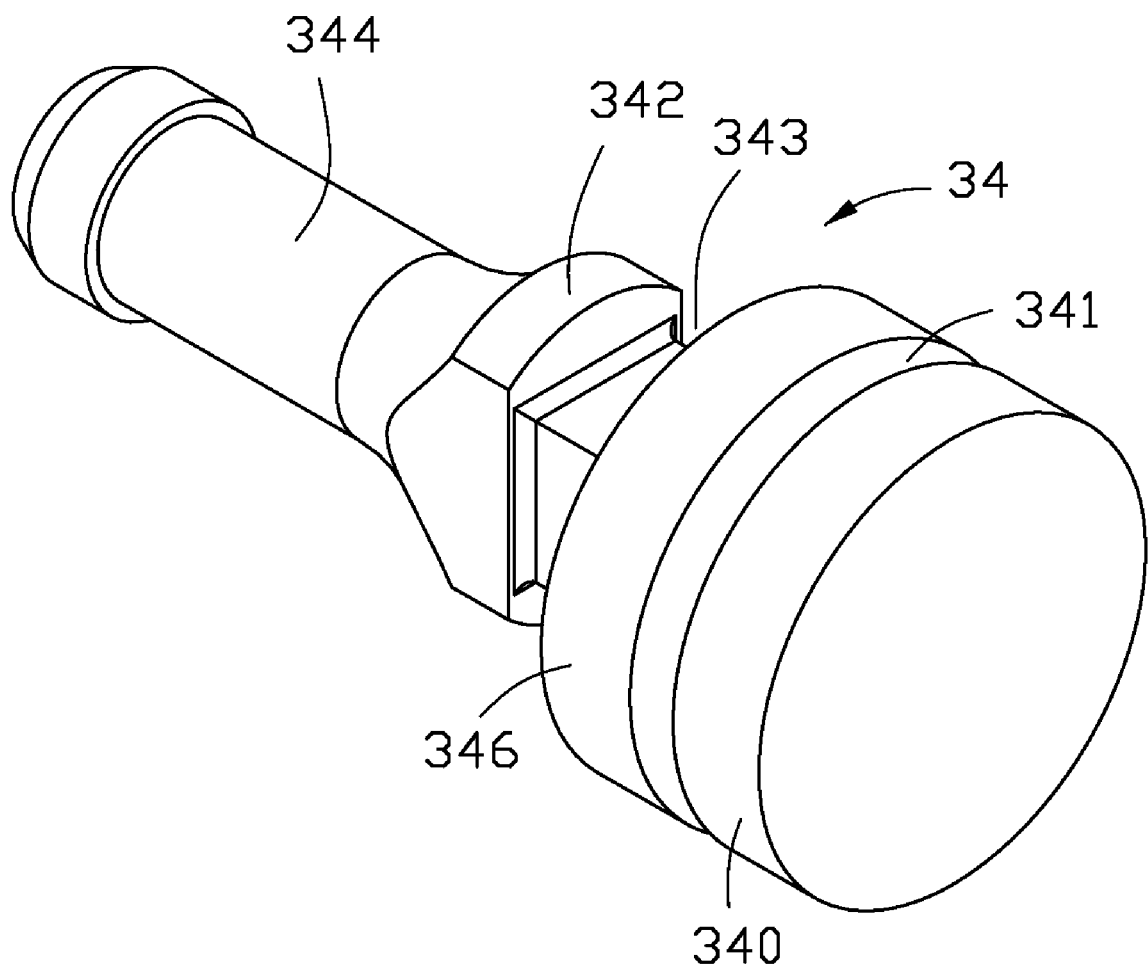
FIG. 3 is an enlarged view of a connecting device of the heat dissipation device of FIG. 2.
Figure 4:
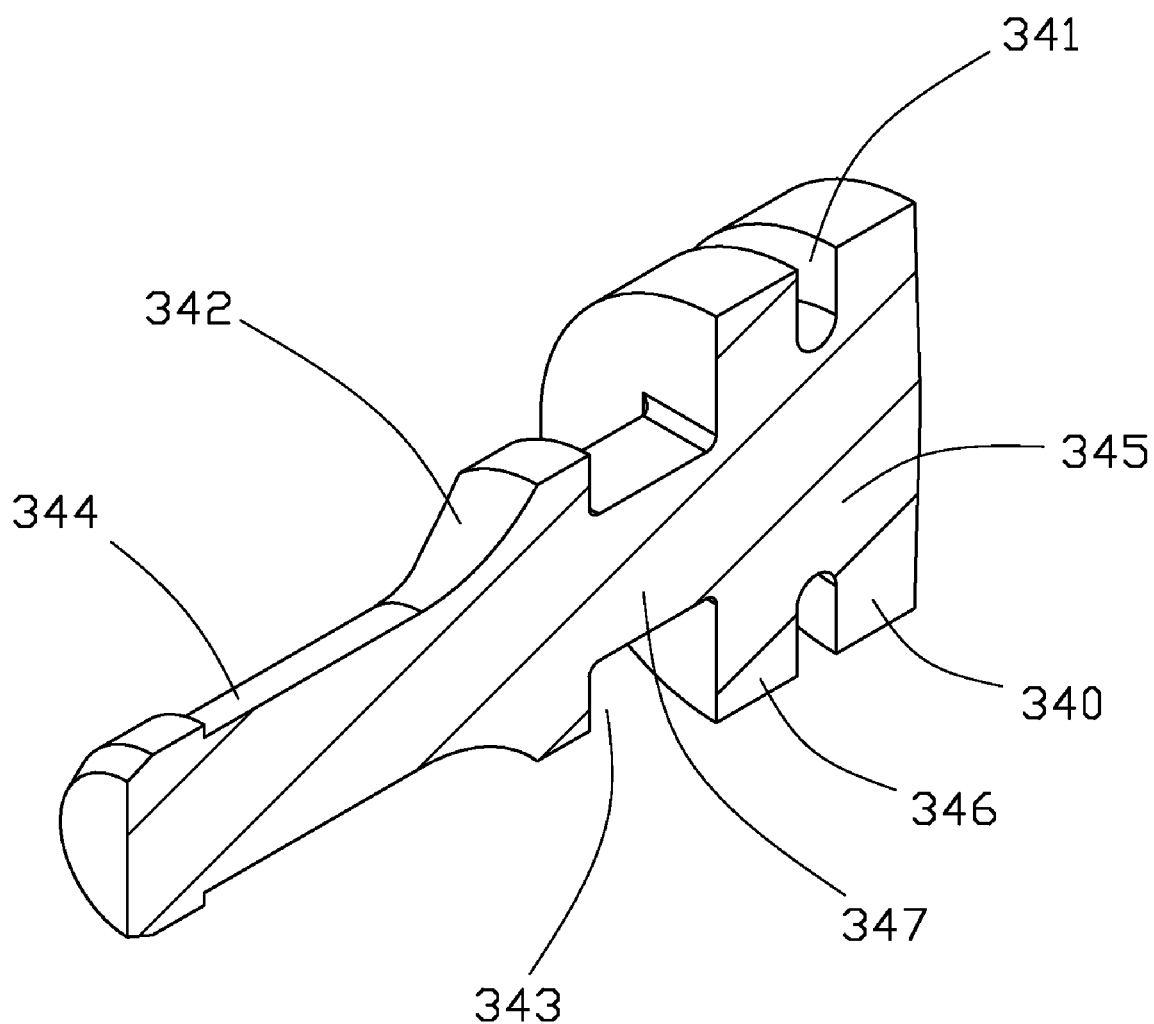
FIG. 4 is a cross-section view of the connecting device of FIG. 3.

Also referring to FIGS. 3-4, each of the two connecting devices 34 is integrally formed of an elastic material such as plastic or rubber. Each connecting device 34 includes a head 340, a baffle portion 346, a cone-shaped retaining portion 342 and a cylindrical shaft 344. The head 340 and the baffle portion 346 are circular, plate-shaped and define an annular first slot 341 therebetween, whereby a first neck 345 is formed between the head 340 and the baffle portion 346. The first neck 345 can be crowded into the cutout 3242 of the positioning portion 324 of the fixing bracket 32. The baffle portion 346 and the retaining portion 342 define a second slot 343 therebetween, whereby a second neck 347 is formed between the baffle portion 346 and the retaining portion 342. The second neck 347 can be inserted into the through hole 28 at a bottom of the second flange 24 of the fan 20. A length of the first slot 341 along an axis of the connecting device 34 is slightly smaller than a thickness of the positioning portion 324, and a length of the second slot 343 along the axis of the connecting device 34 is slightly smaller than a thickness of the second flange 24 of the fan 20. An end of the retaining portion 342 near the second neck 347 has a diameter larger than that of another end of the retaining portion 342 near the shaft 344, and the shaft 344 has a diameter smaller than that of the retaining portion 342, whereby the shaft 344 and the retaining portion 342 can smoothly extend through the through hole 28 at the bottom of the second flange 24 of the fan 20.

In assembly, the evaporating sections 160 of the heat pipes 16 are received and soldered in the channels together formed by the first grooves 1226 of the mounting plate 122 and the second grooves 1247 of the heat spreader 124. The heat conducting plate 182 of the second fin assembly 18 is soldered on the top face of the mounting plate 122 of the base 12. The condensing sections 162 of the heat pipes 16 are inserted in the through holes 142 of the first fin assembly 14. The buckle plates 322 of the two fixing brackets 32 are inserted into the two inserting slits 144 of the first fin assembly 14.

Two screws 300 extend through two through holes at a bottom of the fan cover 26 and engage in two through holes 28 at a bottom of the first flange 22 of the fan 20. The shafts 344 and the retaining portions 342 of the two connecting devices 34 extend through the two through holes 28 at the bottom of the second flange 24 of the fan 20 in sequence to make the second necks 347 insert into the two through holes 28 at the bottom of the second flange 24 of the fan 20, and the second flange 24 of the fan 20 is tightly sandwiched between the retaining portions 342 and the baffle portions 346 of the two connecting devices 34. The first necks 345 of the two connecting devices 34 crowd into the cutouts 3242 of the positioning portions 324 of the two fixing brackets 32, whereby the positioning portions 324 of the fixing brackets 32 are tightly sandwiched between the heads 340 and the baffle portions 346 of the two connecting devices 34. Two screws 300 extend through two through holes 28 at a top of the second flange 24 of the fan 20 and engage in the threaded holes 3240 of the positioning portions 324 of the two fixing brackets 32. Two screws 300 extend through two through holes at a top of the fan cover 26 and engage in two through holes 28 at a top of the first flange 22 of the fan 20.

Four fasteners 1224 are attached on the four arms 1222, wherein two of the four fasteners 1224 block two through holes 28 at the bottom of the first flange 22 of the fan 20. The fasteners 1224 extend through the printed circuit board 40 and engage with a back plate 44 below the printed circuit board 40 to thereby secure the heat dissipation device on the printed circuit board 40 so that the heat spreader 124 can have an intimate engagement with the electronic device 42.

In disassembly, the two screws 300 at the top of the fan cover 26 are disassembled from the top of the first flange 22 of the fan 20 by a screwdriver. The two screws 300 at the top of second flange 24 of the fan 20 are disassembled from tops of the two fixing brackets 32. The heads 340 of the two connecting devices 34 are pulled outwardly to separate the first necks 345 of the two connecting devices 34 from the cutouts 3242 in bottoms of the two fixing brackets 32. Thus the fan 20 is disassembled from the heat sink 10.

According to the disclosure, the two resilient connecting devices 34 connected between the bottom of the fan 20 and the bottoms of the fixing brackets 32 can be disassembled from the bottom of the fixing brackets 32 without using the screwdriver in the case of the fasteners 1224 blocking the two through holes 28 at the bottom of the fan 20 and obstructing the screwdriver from disassembling the fan 20. Thus, it is convenient to disassemble the fan 20.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for cooling an electronic device mounted on a printed circuited board, comprising:
   a heat sink adapted for thermally contacting the electronic device;
   a fan comprising a first flange away from the heat sink and a second flange near the heat sink, a plurality of through holes being defined in corners of the second flange, respectively;
   a fixing device fixing the fan on a side of the heat sink and comprising two fixing brackets secured to the heat sink and a plurality of resilient connecting devices; and
   a plurality of fasteners attached on a bottom of the heat sink and adapted for fastening the heat sink on the printed circuited board;
   wherein each of the connecting devices comprises:
   a head,
   a retaining portion, and
   a baffle portion located between the head and the retaining portion, a first slot being defined between the head and the baffle portion whereby a first neck is formed between the head and the baffle portion, and a second slot being defined between the retaining portion and the baffle portion whereby a second neck is formed between the retaining portion and the baffle portion,
   each of the two fixing brackets having two positioning portions extending from top and bottom ends of a side thereof, respectively, a plurality of screws extending through the through holes in a top of the second flange of the fan and engaging with the positioning portions at the top ends of the fixing brackets, a bottom of the second flange of the fan and the positioning portions at the bottom ends of the fixing brackets being sandwiched between the heads and the retaining portions of the connecting devices, the baffle portions of the connecting devices being sandwiched between the second flange of the fan and the fixing brackets, the positioning portions at the bottom of the fixing brackets each defining a cutout at a lateral side thereof, the first necks being crowded into the cutouts of the bottom positioning portions, and the second necks being inserted in the through holes in the bottom of the second flange of the fan.

2. The heat dissipation device as claimed in claim 1, wherein the retaining portion is cone-shaped, an end of the retaining portion near the second neck having a diameter larger than that of another end of the retaining portion remote from the second neck.

3. The heat dissipation device as claimed in claim 2, wherein each of the connecting devices further comprises a shaft extending from another end of the retaining portion, the shaft being cylindrical and having a diameter smaller than that of the retaining portion.

4. The heat dissipation device as claimed in claim 1, wherein each of the connecting devices is integrally formed of an elastic material, a length of the first slot along an axis of the connecting device being smaller than a thickness of the corresponding positioning portion, a length of the second slot along the axis of the connecting device being smaller than a thickness of the second flange of the fan.

5. The heat dissipation device as claimed in claim 1, wherein each of the two fixing brackets also has a buckle plate extending from another side thereof, the heat sink comprising a base and a fin assembly over the base, the fin assembly comprising a plurality of fins stacked together, the plurality of fasteners being attached on the base, the fin assembly defining two inserting slits in two opposite lateral sides thereof, and the buckle plates of the two fixing brackets being inserted in the two inserting slits of the fin assembly.

6. The heat dissipation device as claimed in claim 5, wherein the heat sink further comprises at least a heat pipe connecting the base and the fin assembly.

7. The heat dissipation device as claimed in claim 5, wherein a lowermost fin of the fin assembly has two guiding plates downwardly extending from two sides thereof.

* * * * *